US006650153B2

(12) United States Patent
Zerilli et al.

(10) Patent No.: US 6,650,153 B2
(45) Date of Patent: Nov. 18, 2003

(54) GENERATOR CIRCUIT FOR VOLTAGE RAMPS AND CORRESPONDING VOLTAGE GENERATION METHOD

(75) Inventors: Tommaso Zerilli, Tremestieri Etneo (IT); Maurizio Gaibotti, Cesano Maderno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/033,711

(22) Filed: Dec. 28, 2001

(65) Prior Publication Data

US 2002/0153928 A1 Oct. 24, 2002

(30) Foreign Application Priority Data

Dec. 29, 2000 (EP) .......................................... 00830869

(51) Int. Cl.[7] ................................................ H03K 4/06

(52) U.S. Cl. ...................................... 327/134; 327/137

(58) Field of Search ............................... 327/108, 111, 327/131, 134, 137, 132

(56) References Cited

U.S. PATENT DOCUMENTS 6,009,534 A * 12/1999 Chiu et al. ............. 331/107 R
6,040,996 A 3/2000 Kong ................... 365/185.19
6,169,433 B1 * 1/2001 Farrenkopf ................ 331/131

FOREIGN PATENT DOCUMENTS

SU 1615864 A1 12/1990

OTHER PUBLICATIONS

European Search Report dated Apr. 2, 2002 for European Application No. 01130836.

* cited by examiner

*Primary Examiner*—Dinh T. Le
(74) *Attorney, Agent, or Firm*—Lisa K. Jorgenson; Stephen Bongini; Fleit, Kain, Gibbons, Gutman & Bongini P.L.

(57) ABSTRACT

A generator circuit for voltage ramps is provided that includes a differential stage with positive feedback coupled between a first and a second voltage reference and having a first output connected to a control terminal of a first output transistor. The first output transistor is connected at an output terminal of the ramp generator circuit to a capacitive charge to be biased with voltage ramps. The ramp generator circuit also includes a second output transistor parallel connected to the first output transistor and having the control terminal connected to a second output of the differential stage.

20 Claims, 7 Drawing Sheets

GENERATOR CIRCUIT FOR VOLTAGE RAMPS AND CORRESPONDING VOLTAGE GENERATION METHOD

CROSS-REFERENCE TO RELATED APPLICATIONS

This application is based upon and claims priority from prior European Patent Application No. 00830869.4, filed Dec. 29, 2000, the entire disclosure of which is herein incorporated by reference.

BACKGROUND OF THE INVENTION

1. Field of the Invention

The present invention relates to electronic circuits, and more specifically to a generator circuit for voltage ramps having improved dynamic operation and a corresponding voltage generation method.

2. Description of Related Art

As is known, in the last generation EEPROM memories, either of the "general purpose" or of the "embedded" types, two fundamental specifications, that are a reduction of the writing time and a greater reliability of the whole memory device, are required.

In particular, in the memories that use the method of Fowler-Nordheim for writing the cells, these two needs are actually in contrast with each other. In fact, in order to guarantee a certain reliability degree, in terms of time of keeping the information and of maximum number of writing cycles allowed, the cell is programmed by a ramp voltage pulse with a slope such to guarantee a control of the highest peak of the Fowler-Nordheim current that goes trough the tunnel oxide layer of the cell.

It is in fact known that such a current peak, that is the main responsible of the decay of a memory cell, is directly co-related to the ramp slope of the programming voltage.

For this reason, in this field ramp generators are very important and they have to be projected in order to guarantee a good control of the voltage slope apart from the output load.

In particular, the programming pulse shown in the FIG. 1 shows a first line, starting from an initial time T*−ΔT* with a duration of ΔT*, showing a ramp pattern with a first high slope and a second line, starting from a time T* for a duration equal to a Tr*, having a ramp pattern with a second slope lower than the first slope. It is also provided a third line at a null slope for a total duration equal to Tr.

The voltage value Vp of such a programming pulse goes from an initial value conventionally equal to 0 to a first value equal to Vs during the first portion of the ramp in order to reach and maintain a top value equal to Vtop during the second portion of the ramp, while the third portion is constant with the top value Vtop.

The use of this double ramp pulse drastically reduces the duration of a first programming step. In fact during such a first phase the Fowler-Nordheim tunneling has not shown out yet or is still of negligible entity and the pulse voltage Vp is maintained below a triggering voltage Vfnt of such a tunneling. The same programming pulse appears then with a second slope efficient for a second programming phase that still uses the Fowler-Nordheim tunneling; in this case, the pulse voltage Vp reaches greater values than the triggering voltage Vfnt.

As far as the EEPROM memory is concerned, typical values are considered which are equal to the following.

$Vs$=6 to 8V $Vtop$=11 to 15V $Tr$=0.5 to 1 ms

Slopes allowed to the second part of the ramp <20 V/ms.

In order to obtain significant time reductions, the first part of the programming voltage ramp Vp must indeed have slopes higher than 50 V/ms.

A ramp generator projected in order to provide such a double ramp pulse must therefore control suitable currents, keeping into consideration that the loads to be driven in the global programmings of whole selected memory matrixes result in being in the order of nanofarads.

A further complication in projecting such ramp generators derives from the necessity of reducing the top values operated inside the generators by means of the memory devices in order to face up to the scaling effects deriving from the use of a more and more reduced integration geometry.

This need imposes the use of lower and lower boosted voltage levels and also the project of ramp generators that use the top voltage available inside the memory device as much as possible.

A typical ramp generator of the known type, used to generate a double ramp programming pulse for memory cells of the EEPROM type, is schematically shown in FIG. 2.

The ramp generator 1 comprises an operational amplifier 2 supplied by a first supply voltage reference HVP, in particular a voltage HVP generated by means of a booster incorporated in the memory device that is not illustrated since it is conventional. The first voltage reference HVP coincides to the top voltage available inside the memory device.

The operational amplifier 2 also shows a first inverter input terminal IN1, on which a first reference voltage Vref and a second non-inverter input terminal IN2, receiving a second internal voltage BOT, are applied.

Such a reference Vref voltage is generated for example by means of a Bandgap circuit (that is also not illustrated since it is conventional).

An output terminal of the operational amplifier 2 is connected to a control terminal of a MOS transistor M1 of the P type, that is in turn inserted between the first voltage reference HVP and an output terminal OUT of the ramp generator 1.

The output terminal OUT of the ramp generator 1 is further connected to a second voltage reference, particularly to a GND through the series of a first capacitor C1 and a current I1 generator G1. Between the output terminal OUT and the GND there is also a second load capacitor C2.

The interconnection node X1 between the first capacitor C1 and the generator G1 is feedback connected to the second non-inverter input terminal IN2 of the operational amplifier 2.

The second capacitor C2 substantially corresponds to the load seen by the ramp generator 1, the value of which particularly depends on the number of bytes selected in the memory matrix to be programmed.

The current generator G1 is indeed obtained by a reference value already available inside the memory device and can be varied by means of suitable mirror current relations in order to obtain the first and the second required slopes. In fact, the output voltage Vout of the ramp generator 1 shows a ramp pattern having a slope equal to the following.

$$\text{Slope}=I1/C1$$

It should be noted that the ramp generator 1 has a first amplification stage S1, essentially comprising the operational amplifier 2 and a second output stage S2 comprising the transistor M1, the capacitors C1 and C2 and the generator G1.

Particularly, the first amplification stage S1 biases, by means of a virtual short circuit, the current generator G1 so that:

$$dVout/dt=I1/C1-dV1/dt=I1/C1=K$$

with Vout being the output voltage of the ramp generator 1; V1 being the potential present at the terminal X1; and K being the required slope.

Indeed, the output stage S2 operates a voltage/current conversion. In particular, the use of the MOS transistor M1 of the P type in the output stage S2 allows a suitable gm transconductance value to be obtained, as well as a regulation of the loop gain of the set operational amplifier 2/ transistor M1/ capacitor C1, thanks to the amplification of the first stage S1, so that the maximum value of the voltage ramp produced by the generator G1 and by the first capacitor C1 is exactly equal to the top voltage value of the memory device.

Although it is advantageous under many points of view, this first solution shows many drawbacks, particularly the one of stabilization in frequency.

In fact, the sizing of single components of the ramp generator 1 must be taken keeping into consideration of an Iout current, to be operated by the output terminal OUT, given by the following $$Iout=C2(dVout/dt)$$

Such sizing must also provide a suitable phase margin in order to guarantee the ramp generator 1 stability in case of variability during its manufacturing process, as well as depending on the operation temperature range of the same, on the supply voltage range and on the applied load variations.

All this causes a great manufacturing difficulty and the sizing of the ramp generator 1 according to the prior art.

In fact, because of the extended variability of the parameters, even a simulated phase margin of 35 degrees could not guarantee the necessary safety in terms of generator stability as a whole. It is suitable to note that such a phase margin can only be obtained with a great waste of area (so called compensation with dominant pole) or with factors PSRR unsuitable for the type of application (so called zero-pole compensation).

A second known solution provides the use of an output stage S2 of the voltage follower type, that is a stage that uses an output MOS transistor of the N type.

In such a way an intrinsically steady ramp generator 1 is obtained, and also an output Voltage Vout of a maximum value invalidated by a threshold voltage value of a transistor of the N type, that is a value lower than the one predetermined or desired for a correct memory cells programming.

SUMMARY OF THE INVENTION

In view of these drawbacks, it is an object of the present invention to overcome the above-mentioned drawbacks and to provide an improved double ramp voltage generator (e.g., for programming memory cells). A preferred embodiment of the present invention provides a generator circuit for voltage ramps that includes a differential stage with positive feedback, having an output connected to the control terminal of a first output transistor connected to a capacitive load to be biased with voltage ramps. The present invention also provides a method for generating voltage ramps in biasing circuits of capacitive loads for memory devices, of the type in which the load receives a double ramp voltage signal with a first predetermined slope and a second slope lower than the preceding one.

Another object of the present invention is to use a first output stage showing a mixed structure with a pair of transistors, PMOS and NMOS, each activated at a corresponding portion of the voltage ramp.

One embodiment of the present invention provides a generator circuit for voltage ramps is provided that includes a differential stage with positive feedback coupled between a first and a second voltage reference and having a first output connected to a control terminal of a first output transistor. The first output transistor is connected at an output terminal of the ramp generator circuit to a capacitive charge to be biased with voltage ramps. The ramp generator circuit also includes a second output transistor parallel connected to the first output transistor and having the control terminal connected to a second output of the differential stage.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Because the present invention is particularly suited to a generator circuit for voltage ramps used to program cells in a non-volatile memory of the EEPROM type, the following description is made with reference to this field of application. However, this is for convenience of illustration only, and the present invention is not exclusively limited to this field. For example, the use of such a generator circuit in the field of EPROM and FLASH-EEPROM memories is known to one of ordinary skill in this art.

Figure 3:
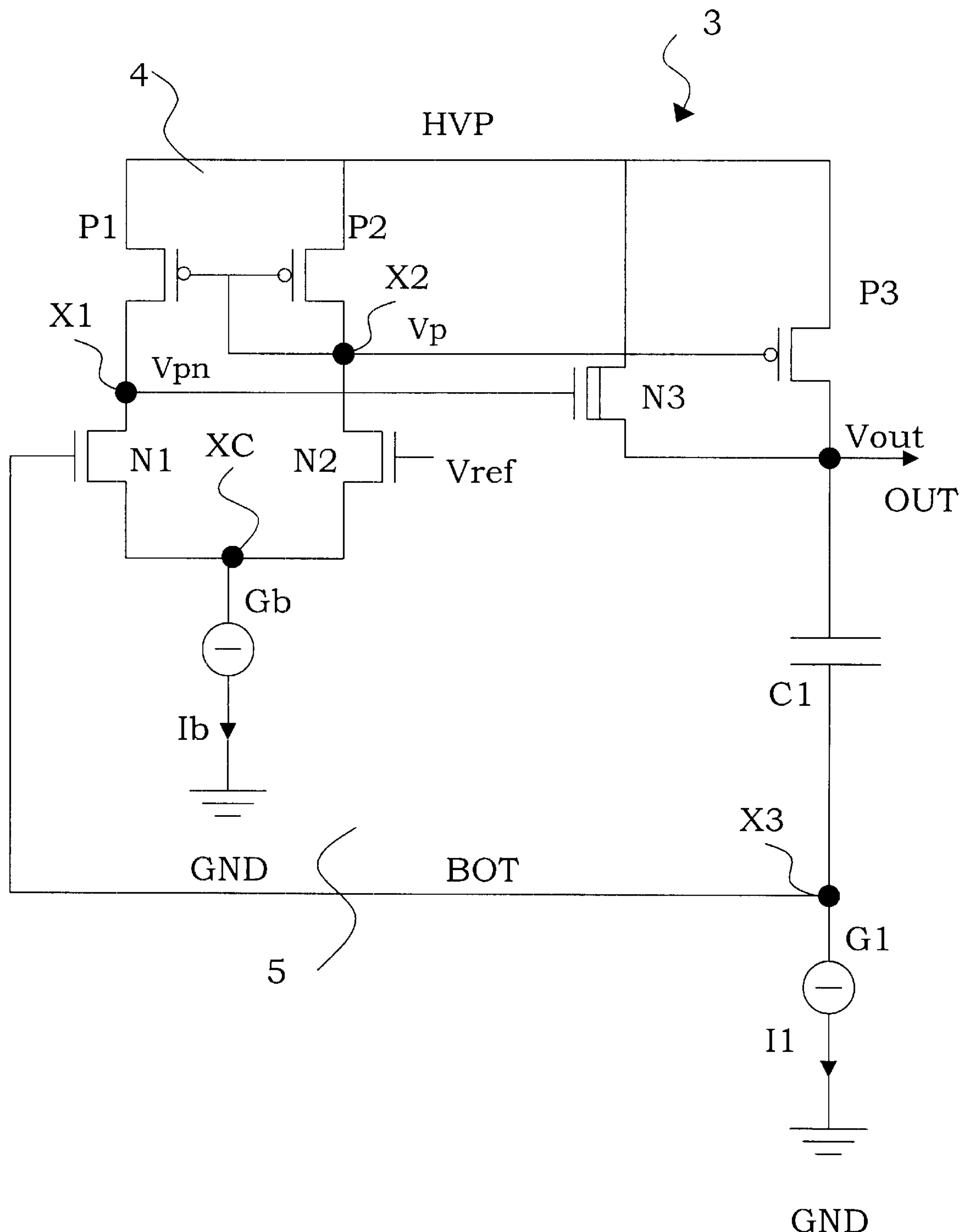
FIG. 3 schematically shows a ramp generator performed according to a preferred embodiment of the present invention.

FIG. 3 shows a ramp generator according to a preferred embodiment of the present invention.

As shown, the ramp generator has been realized according to the principle for which the major contribute, in terms of output voltage, is required at low voltage levels, that is during a first programming phase that uses a voltage ramp at a high slope (fast slope).

During this first programming phase, a voltage follower stage is then enough to provide the ramp voltage pattern at a high slope, as required by the specifications. Furthermore, such a voltage follower stage allows to obtain also the necessary current contribution if it is suitably sized.

During a second programming phase that uses a ramp with a lower slope, the voltage output from the ramp generator 3 is at least three times lower and can be generated through a circuit showing a PMOS type output stage, and with a reduced value of the current capacity. It is thus obtained an increase on the phase margin higher than the one that would be obtained in the case of an output stage formed in order to guarantee a suitable voltage value to be outputted during the fast slope. Particularly, an output stage of the PMOS type with a reduced value of the product between the transconductance (gm) and the loop gain (A) will be taken hereafter into consideration.

Advantageously, according to the invention the ramp generator 3 shows a mixed structure comprising a follower voltage PMOS output stage, in which a low output gain of a single-ended differential structure is used to drive the PMOS output stage.

The ramp generator 3 comprises thus a differential structure 4, that is inserted between a first high voltage reference and a second voltage reference, particularly a ground GND.

The differential structure 4 comprises a first N1 and a second N2 input MOS transistors of the N type, which are inserted between the first high voltage Reference HVP and a second voltage reference, particularly a ground GND. More particularly such transistors N1 and N2 have a conduction terminal in common in a node coupled to the ground GND by means of a first generator Gb of a control current Ib.

The second NMOS transistor N2 has a control terminal that represents the input of the operational amplifier 4 and that receives a reference voltage Vref, while the first NMOS transistor N1 has a control terminal connected to an internal circuit node X3.

The differential structure 4 further comprises a biasing stage comprising a first P1 and a second P2 MOS transistors of the P type. Such first P1 and second P2 PMOS transistors form a current mirror with a ratio equal to K and are inserted between the fist high voltage reference HVP and the input transistor pair N1 and N2.

An interconnection node X1 between the transistor P1 and the transistor N1 is a first output of the differential structure 4. An interconnection node X2 between the transistors P2 and N2 represents a second output of the differential structure 4.

Advantageously according to the invention, the ramp generator 3 further comprises a first output NMOS transistor N3 inserted between the first high voltage reference HVP and an output terminal OUT of the ramp generator 3. Such a transistor N3 has a control terminal connected to the first output X1 of the differential structure 4. A second output transistor P3, this time of the P type, is in turn inserted between the first high voltage reference HVP and the output terminal OUT, and has a control terminal connected to the second output X2.

The first output transistor N3 is essentially connected in parallel to the second output transistor P3, but it is driven by a different output of the differential structure 4. In a preferred embodiment the transistor N3 is of the natural type.

Finally, the output terminal OUT is connected towards ground GND by means of a capacitor C1, that is in turn coupled to the ground GND by means of a second generator G1 of a current I1.

An interconnection node X3 between the capacitor C1 and the second generator G1 is connected to a control terminal of the transistor N1.

At the circuit nodes X1, X2, X3 there are the corresponding voltage signals Vpn, Vp and BOT.

The set of the capacitor C1, of the first NMOS transistor N1 and of the first NMOS output transistor N3 forms a feedback loop 5 for the output terminal OUT of the ramp generator 3.

Figure 1:
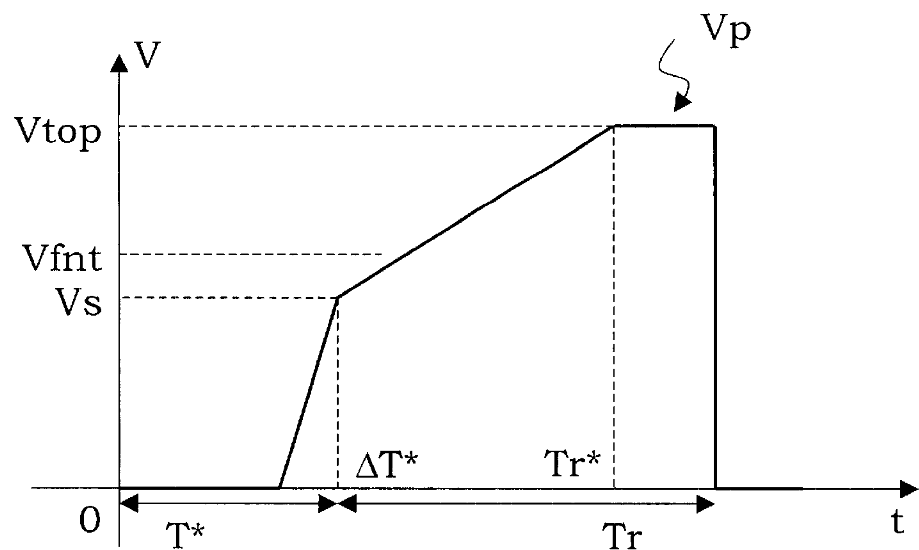
FIG. 1 schematically shows a double ramp pulse for programming memory cells.
Figure 2:
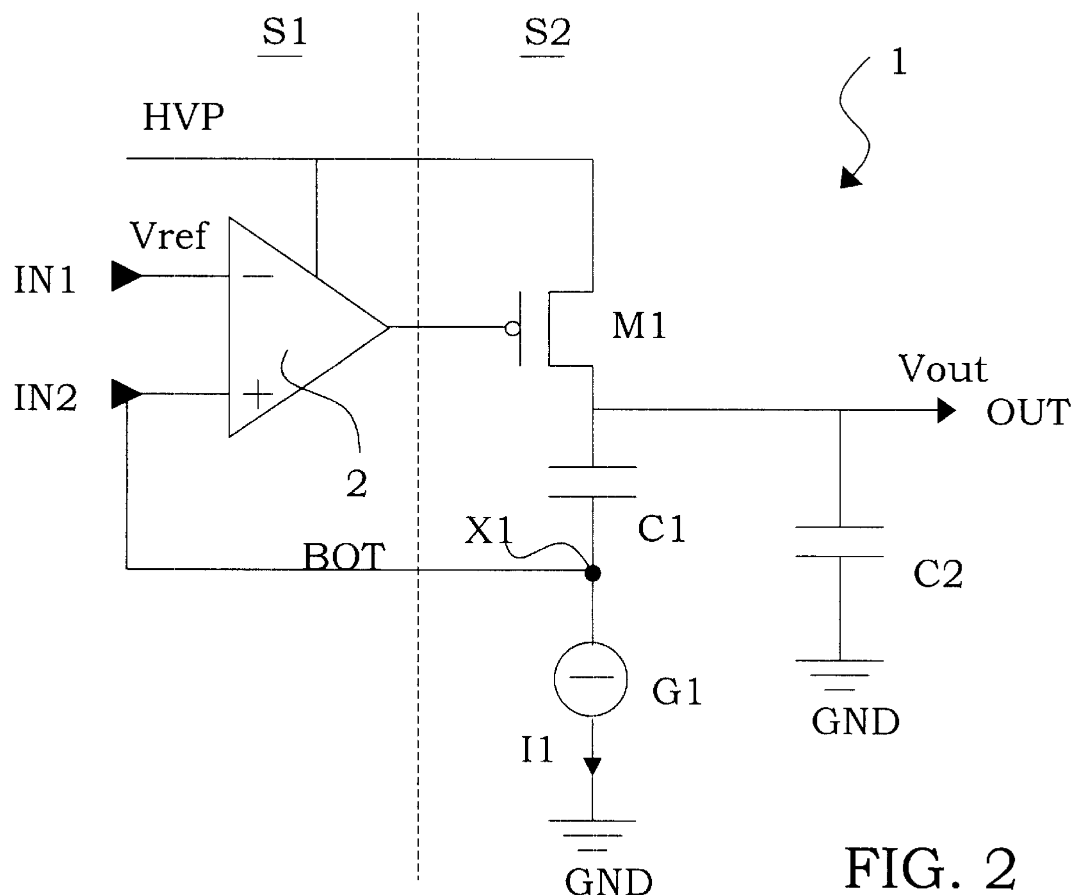
FIG. 2 schematically shows a conventional ramp generator.

In such a way at the output terminal OUT is obtained an output voltage Vout signal having a double ramp pattern that is analogous to the one shown in FIG. 1 with reference to the prior art, comprising a first portion of fast slope and a second portion of slow slope.

Hereafter it will be described the operation of the ramp generator 3 according to the invention.

The current value that flows through the second output PMOS transistor P3 is co-related to the control current Ib of the second generator G1.

When the current value required by the output terminal OUT, and thus by the load to be driven, exceeds half (Ib/2) of the control current Ib, the differential structure 4 forces the first internal voltage signal Vpn at the node X1 to increase of a suitable quantity equal to the value necessary to the first output NMOS transistor N3 to provide the exceeding current.

The main advantage of the ramp generator 3 according to the invention is that the sizing of the first output transistor N3 is made on the basis of the maximum foreseen load without caring about possible instability effects occurring inside the feedback loop 5 of the ramp generator 3.

The sizing of the second output PMOS transistor P3 is made depending on the maximum current required during the second part of the slow slope. In fact, as soon as the first internal voltage signal Vpn reaches the maximum allowed value, that is the value of the first high voltage reference HVP, the first output NMOS transistor N3 turns off and the last portion of the voltage ramp Vout generated at the output terminal OUT of the ramp generator 3 is generated by means of only the second output PMOS transistor P3.

In particular, such last portion shifts the output voltage Vout value from HVP−Vth(N3) to HVP, Vth(N3) being the threshold voltage value of the first output NMOS transistor N3.

Also in this case, the output ramp regulation does not show particular problems, since it is possible to act simply on the mirror ratio K until the loads to handle are in the order of hundreds of pF. In such a case, in fact, by imposing a mirror ratio K equal to 1, in order to obtain a required slope of 10 V/ms, it happens that the current to be handled is equal to 1 uA (100 pF*10 V/ms).

When the load exceeds such a value, reaching for example the nanoFarad, a value of the mirror ratio K higher than 10 should be imposed, or a higher value for the control Ib current should be used. In such a case, it is preferred to use a first and a second variations of the ramp generator 3 according to the invention that comprises an increasing overdrive network, as schematically shown in FIGS. 4A and 4B.

Figure 4A:
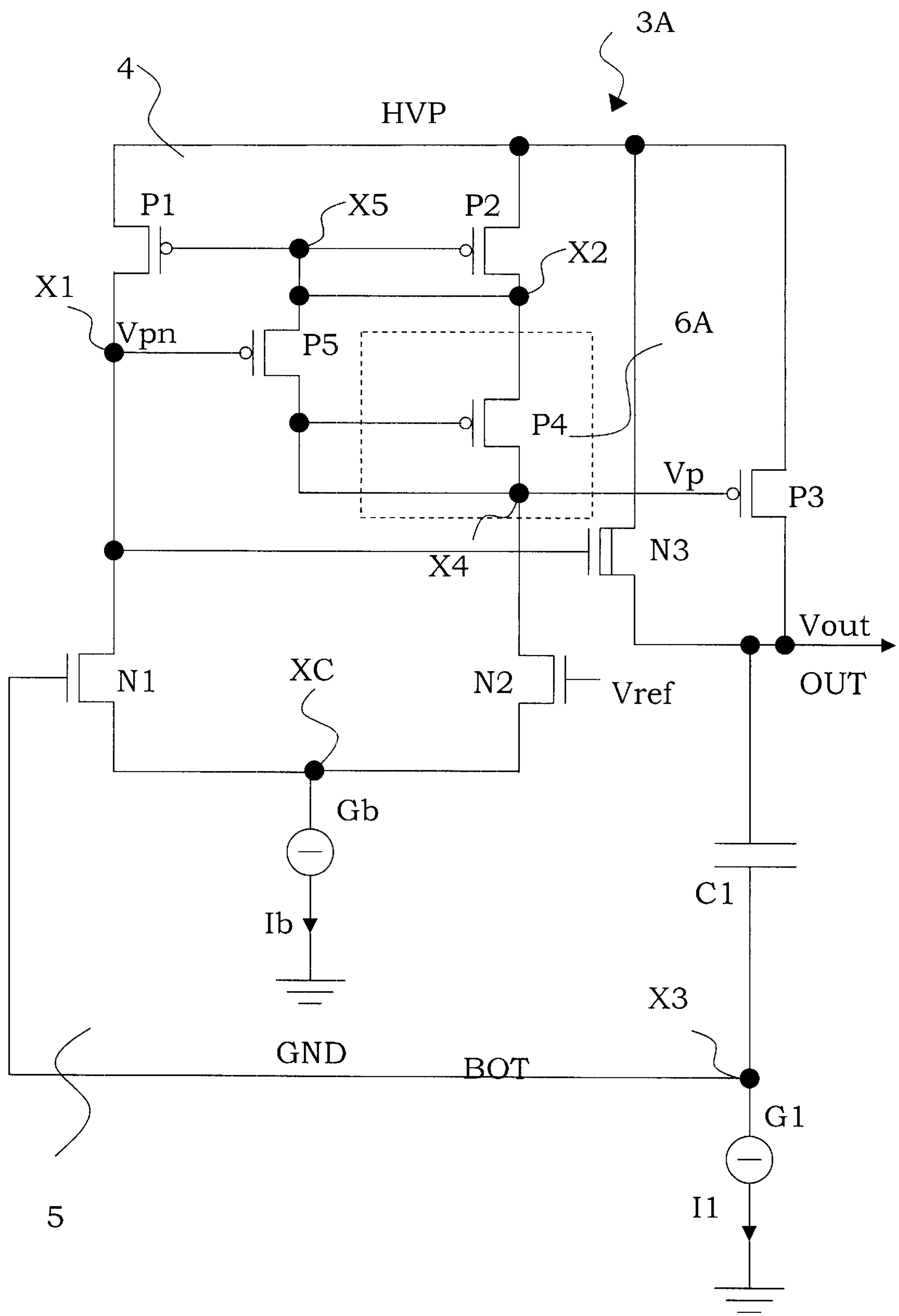
FIGS. 4A and 4B schematically show another embodiment of a particular ramp generator of FIG. 3.
Figure 4B:
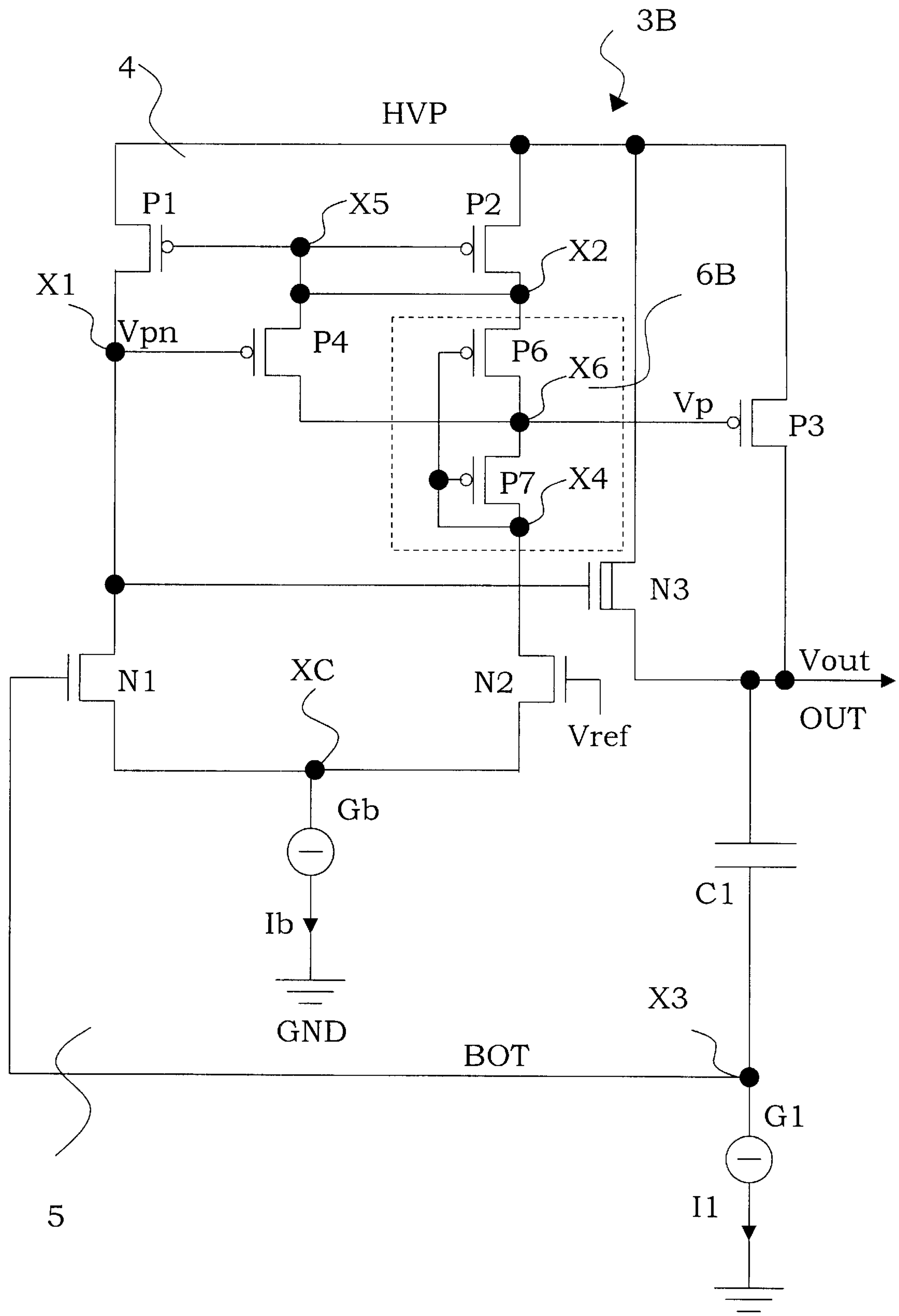

In particular, FIG. 4A shows a ramp generator 3A comprising an overdrive increasing network 6A corresponding to an entire threshold voltage value of a PMOS transistor, while FIG. 4B shows a ramp generator 3B, comprising an overdrive increasing network 6B corresponding to a fraction of such a threshold voltage.

As it has been seen describing the solution of FIG. 3, the ramp generator 3A comprises a first biasing PMOS transistor P1 and a second biasing PMOS transistor P2 which are current mirror configured and connected to the first N1 and the second N2 input NMOS transistors respectively, as well as to the first generator Gb of the control current Ib. The ramp generator 3A further comprises the second generator G1 and the capacitor C1 inserted in the feedback loop 5 between the output terminal OUT and the control terminal of the first NMOS transistor N1.

Advantageously according to the first modified embodiment, the differential structure 4 further comprises an overdrive increasing network 6A which is inserted between the output terminal X2 of the differential structure 4 and a terminal X4 corresponding to the drain terminal of the NMOS transistor N2, that is in turn connected to the control terminal of the output PMOS transistor P3.

More particularly, the overdrive increasing network 6A essentially comprises a diode connected PMOS transistor P4 which is inserted between the node X2 and the node X4.

The ramp generator 3A also comprises a further PMOS transistor P5 which is inserted between a node X5, corresponding to the control terminals shared by the biasing transistors P1 and P2 and the node X4, and having a control terminal connected to the node X1 whereat the first internal voltage signal Vpn is. The node X5 is in turn connected to the node X2.

This structure uses once more two outputs of the differential structure 4, the outputs of which correspond to the nodes X1 and X4.

It is suitable to note that the overdrive increasing network 6A uses a simple mechanism for automatically increasing the overdrive of the first output PMOS transistor P3, by essentially using the dynamic evolution of the first output X1 of the differential structure 4 whereat the first voltage internal signal Vpn is.

The overdrive increase obtained by means of the overdrive increasing network 6A is thus equal to an entire threshold value of a MOS transistor of the P type.

In FIG. 4B a second modified embodiment of the ramp generator 3 is shown and generally and schematically indicated with 3B.

Also in the case of this second modified embodiment, the ramp generator 3B comprises an overdrive increasing network 6B which is inserted between the node X2 and the node X4 of the differential structure 4 of the ramp generator 3B and connected to the PMOS transistor P3.

More particularly, this overdrive increasing network 6B comprises a first overdrive PMOS transistor P6 inserted between the node X2 and a further node X6 and having the control terminal connected to the control terminal of a second overdrive PMOS transistor P7 that is diode connected and in turn inserted between the node X6 and the node X4 corresponding to the drain terminal of the second NMOS transistor N2.

The node X6 is in turn connected to the control terminal of the second output PMOS transistor P3.

In this modified embodiment, the PMOS transistor P5 is inserted between the node X5, connected in turn to the node X2, and the node X6, connected in turn to the control terminal of the second output transistor P3.

It should be noted that the overdrive increasing network uses anyway a mechanism for increasing the output PMOS transistor P3 overdrive by utilizing the dynamic evolution of the first output X1 of the differential structure 4 whereat the first voltage internal signal Vpn is, and by splitting such an increase over the first P6 and second P7 overdrive transistors.

The figures from 5 to 9 schematically show the results of a simulation performed on the inventive ramp generator 3 and on its modified embodiments.

In particular, the two extreme loading conditions have been kept into consideration, that are a first programming case (A) of a single Byte, with an approximate load of 20 pF in relation to the programming output voltage Vout, and a second case (B) for global programming the whole selected memory cell matrix, in case of a matrix of 512 Kbit this load being of about 800 pF in relation to the programming output voltage Vout.

Further, the differential structure 4 is biased by means of a current of 1 uA, while the ramp generator uses a current of 500 nA for carrying out the first part of fast slope and of about 170 nA for carrying out the second part of slow slope.

The value of the reference voltage Vref (generated for example by means of a Bandgap circuit) is constant and equal to 1.33V.

Figure 5:
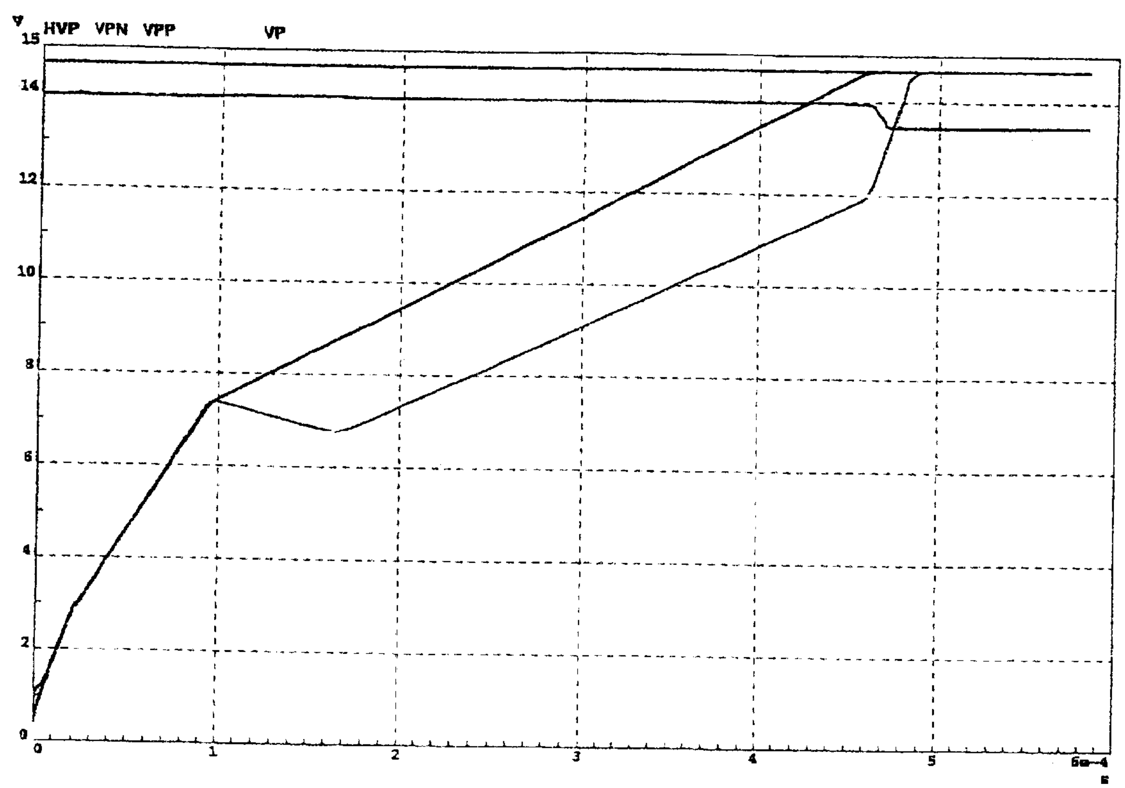
FIGS. 5 to 9 schematically show the pattern of suitable signals inside the ramp generator of FIG. 3.

FIG. 5 schematically shows the pattern of the output voltage Vout signal that is obtained in the first case (A) by programming a single Byte, and the pattern of the voltage internal signals Vpn and Vp.

It is first considered that the first high voltage reference HVP is at its standard value (in the example it has been used value of 15V) and that the first Vpn and the second voltage internal signals Vp are at the beginning in a certain defined state, that is 0 and HVP.

In particular it is possible to consider a suitable start-up circuitry that provides for the resetting of the initial conditions.

The first voltage internal signal Vpn at the first output X1 of the differential structure 4 leads the output voltage Vout signal throughout the voltage follower stage comprising the first output NMOS transistor N3 during the whole period of the fast slope.

In such a way the node X2, whereat the second voltage internal signal Vp is, reaches the necessary value for correctly biasing the second output PMOS transistor P3.

Figure 6:
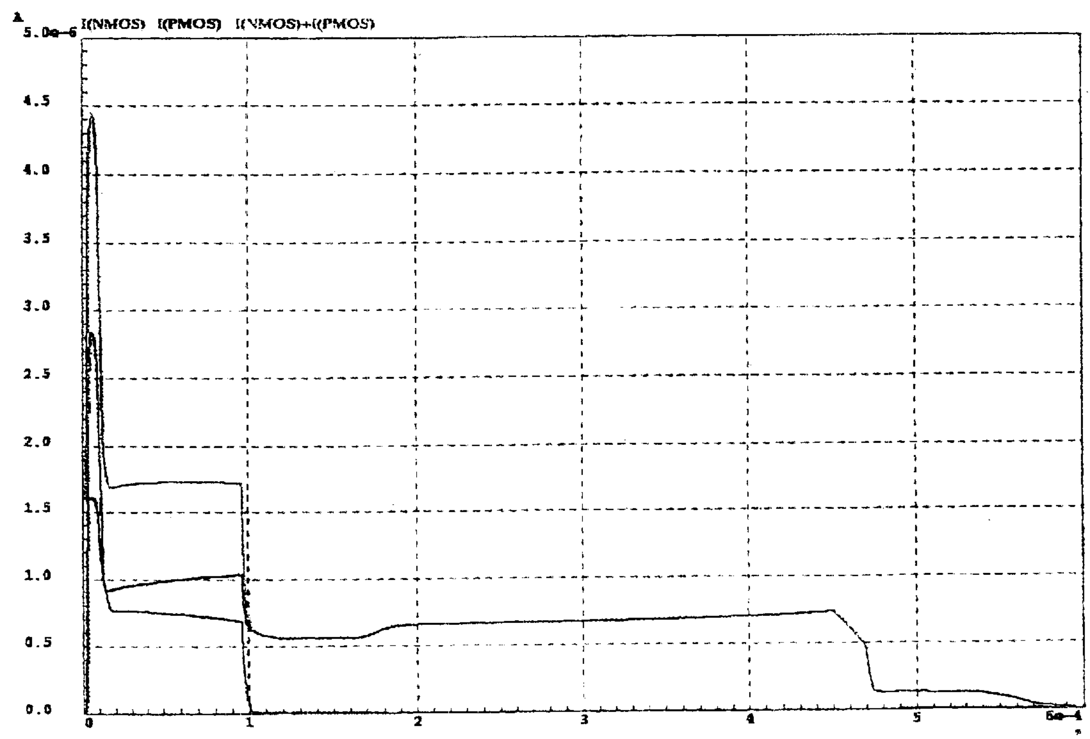

As it is shown in FIG. 6, the voltage follower output stage, comprising the second PMOS transistor P3, injects a constant current that is certainly of an insufficient value into the output terminal OUT during the fast slope, since the current required by the load is of about 1.7 uA (500 nA+20 pF*60V/ms)>1 uA, that is the maximum current that the second output PMOS transistor P3 can supply.

During the slow slope the current required by the output terminal OUT is indeed equal to about 400 nA (=20 pF*20 V/ms): the contribute of the voltage follower output stage is therefore not necessary anymore and the first node X1, whereat the first voltage internal signal Vpn is, goes below the level of the output voltage Vout signal, thereby turning completely off the voltage follower output stage.

Actually the ramp generator 3 according to the invention is performed in such a way that the first voltage internal signal Vpn is not completely discharged but follows at a certain distanced rate (extra current contribute of 200 nA=10 pF*20 V/ms since the first voltage internal signal Vpn is charged with a concentrated capacitor of 10 pF due to stability reasons) the output voltage signal Vout.

As soon as the output voltage signal Vout at the output terminal OUT reaches the first high voltage reference HVP, the differential structure 4 increases, through the second voltage internal signal Vp, the second output PMOS transistor P3 overdrive, since the drain-source voltage Vds of such a transistor approximates to 0, but the current generator G1 continues to require current (of about 170 nA).

Figure 7:
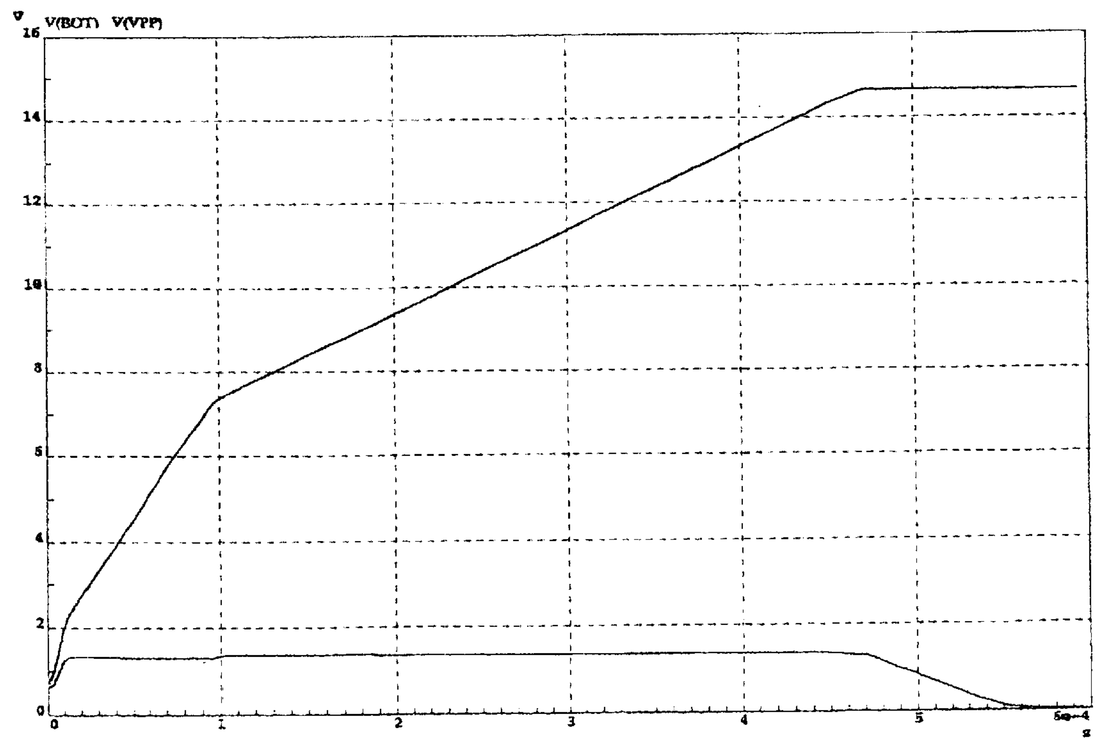

The current generator G1 turns completely off when the internal circuit node X3 whereat the third internal voltage signal BOT is, turns out to be discharged (as it is schematically shown in FIG. 7).

Figure 8:
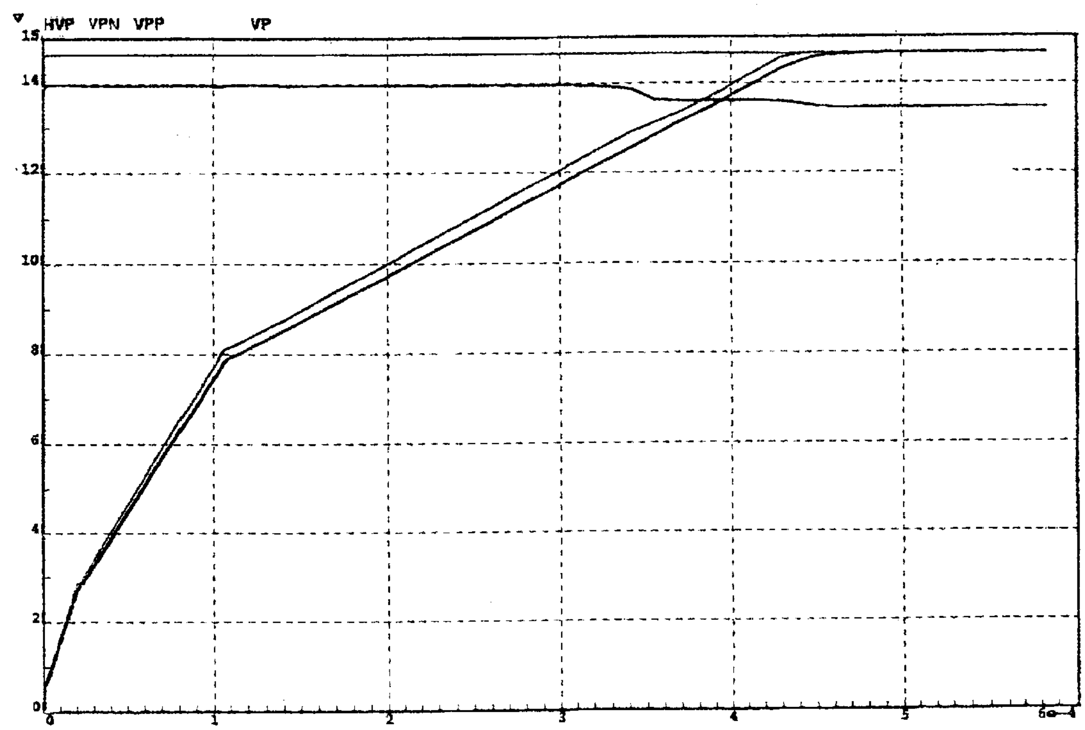
Figure 9:
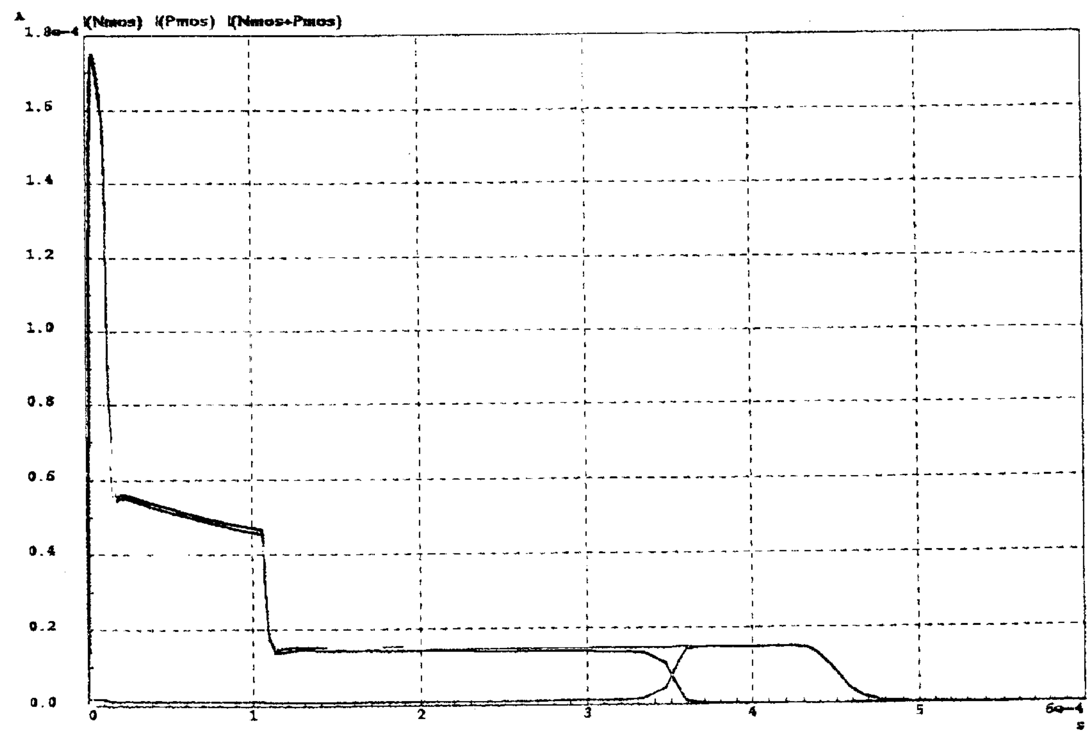

In the second case (B) of global programming, given the same conditions of the previous case, it is possible to note in FIGS. 8 and 9 how the voltage follower output stage, comprising the second output PMOS transistor P3, remains active also during the slow slope.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A generator circuit for voltage ramps, said generator circuit comprising:

a first output transistor;

a differential stage with positive feedback coupled between a first and a second voltage reference, the differential stage including a first output connected to a control terminal of the first output transistor;

an output terminal coupled to the first output transistor; and a second output transistor parallel connected to the first output transistor, the second output transistor having its control terminal connected to a second output of the differential stage.

2. The generator circuit according to claim 1, wherein the second output transistor has conduction terminals connected to the first voltage reference and to the output terminal.

3. The generator circuit according to claim 1, wherein the second output transistor is an NMOS transistor.

4. The generator circuit according to claim 1, wherein the second output transistor is a natural NMOS transistor.

5. The generator circuit according to claim 1, further comprising an overdrive increasing network coupled between the first output of the differential stage and the control terminal of the first output transistor.

6. The generator circuit according to claim 5, wherein the overdrive increasing network includes at least one transistor that is diode connected and coupled between the first output of the differential stage and the control terminal of the first output transistor.

7. The generator circuit according to claim 5, further comprising an additional transistor coupled between the first output of the differential stage and the control terminal of the first output transistor, the additional transistor having its control terminal connected to the second output of the differential stage.

8. The generator circuit according to claim 1, further comprising an overdrive increasing network coupled between the first output of the differential stage and an internal node of the differential stage and connected to the control terminal of the first output transistor.

9. The generator circuit according to claim 8, wherein the overdrive increasing network includes at least first and second PMOS transistors coupled in series between the first output of the differential stage and the internal node of the differential stage and connected with each other at an internal circuit node that is connected to the control terminal of the first output transistor.

10. The generator circuit according to claim 9, wherein the first PMOS transistor is coupled between the first output and the internal circuit node and is provided with a control terminal connected to a control terminal of the second PMOS transistor that is diode connected and coupled between the internal circuit node and the internal node of the differential stage.

11. The generator circuit according to claim 8, further comprising a transistor coupled between the first output of the differential stage and the control terminal of the first output transistor and having a control terminal connected to the second output of the differential stage.

12. A method for generating a double ramp voltage signal for a capacitive load, the double ramp voltage signal having a first portion whose slope is higher than a second portion, said method comprising the steps of:

generating the first portion of the double ramp voltage signal by means of a voltage follower stage that is connected to the capacitive load; and generating the second portion of the double ramp voltage signal by means of a PMOS output stage that is connected to the capacitive load, wherein the steps of generating the first portion and generating the second portion are alternatively activated depending on a voltage level required by the capacitive load.

13. The method according to claim 12, wherein the PMOS output stage has a reduced value of the product between transconductance and loop gain.

14. The method according to claim 12, wherein the voltage follower stage includes a first output transistor which is driven by a first output of a differential stage, the PMOS output stage includes a second output transistor which is driven by a second output of the differential stage, and the steps of generating the first portion and generating the second portion are alternatively activated by a regulation loop for activating the first output transistor or the second output transistor depending on the voltage level required by the capacitive load.

15. A memory device including at least one generator circuit for voltage ramps, said generator circuit comprising:

a first output transistor;

a differential stage with positive feedback coupled between a first and a second voltage reference, the differential stage including a first output connected to a control terminal of the first output transistor;

an output terminal coupled to the first output transistor; and a second output transistor parallel connected to the first output transistor, the second output transistor having its control terminal connected to a second output of the differential stage.

16. The memory device according to claim 15, wherein the second output transistor has conduction terminals connected to the first voltage reference and to the output terminal.

17. The memory device according to claim 15, wherein said generator circuit further comprises an overdrive increasing network coupled between the first output of the differential stage and the control terminal of the first output transistor.

18. The memory device according to claim 15, wherein said generator circuit further comprises an overdrive increasing network coupled between the first output of the differential stage and an internal node of the differential stage and connected to the control terminal of the first output transistor.

19. The generator circuit according to claim 1, further comprising a capacitive load coupled to the output terminal.

20. The generator circuit according to claim 1, further comprising a capacitor coupled between the first output transistor and an input of the differential stage.

* * * * *